(12) United States Patent
Lee

(10) Patent No.: US 7,781,829 B2
(45) Date of Patent: Aug. 24, 2010

(54) SEMICONDUCTOR DEVICE HAVING RECESSED CHANNEL AND METHOD FOR MANUFACTURING THE SAME

(75) Inventor: Jin Yul Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 76 days.

(21) Appl. No.: 12/121,637

(22) Filed: May 15, 2008

(65) Prior Publication Data
US 2009/0146243 A1 Jun. 11, 2009

(30) Foreign Application Priority Data
Dec. 10, 2007 (KR) ............. 10-2007-0127859

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .................. 257/330; 257/332; 257/510

(58) Field of Classification Search .......... 257/330, 257/332, 510
See application file for complete search history.

(56) References Cited

U.S. PATENT DOCUMENTS

| 7,019,342 B2 | 3/2006 | Hackler, Sr. et al. |
| 7,087,952 B2 | 8/2006 | Zhu et al. |
| 7,432,162 B2 * | 10/2008 | Chung et al. ............. 438/270 |

FOREIGN PATENT DOCUMENTS

KR  10-0696764  3/2007

* cited by examiner

Primary Examiner—Thien F Tran
(74) Attorney, Agent, or Firm—Marshall, Gerstein & Borun LLP

(57) ABSTRACT

A semiconductor device having a recessed channel and a method for manufacturing the same. The semiconductor device comprises a semiconductor substrate formed with an isolation layer defining an active region including a channel region and a junction region, a recessed trench including a top trench formed within the channel region of the semiconductor substrate and a bottom trench formed from a bottom surface of the top trench with a width narrower than the top trench, and a gate stack overlapping the recessed trench and extending across the active region.

3 Claims, 24 Drawing Sheets

US 7,781,829 B2

SEMICONDUCTOR DEVICE HAVING RECESSED CHANNEL AND METHOD FOR MANUFACTURING THE SAME

CROSS-REFERENCE TO RELATED APPLICATION

Priority to Korean patent application number 10-2007-0127859, filed on Dec. 10, 2007, which is incorporated by reference in its entirety, is claimed.

BACKGROUND OF THE INVENTION

The invention relates to a semiconductor device and, more particularly, to a semiconductor device having a recessed channel and a method of manufacturing the semiconductor device.

Higher degrees of integration of semiconductor devices and abrupt shrinkage of design rules have led to increased difficulties in ensuring reliable transistor operation. Particularly, in sub-50 nm semiconductor device design rules in which transistors are correspondingly small, limitations are imposed on cell threshold voltages (Vt) and refresh margins.

Accordingly, diverse methods for ensuring an effective channel length without increasing the design rule are being researched. One such method for effective channel length extension involves extending the length of a channel with respect to a restricted gate line width, embodied in a transistor including a recessed channel and a fin field effect transistor (FinFET) having a fin-shaped active region. However, double data rate 2 (DDR2) dynamic random access memory (DRAM) products currently being used are prone to drastic reductions in data retention time under high temperature test conditions, compared to earlier DDR DRAM products. Also, reduction in the width of an active region results in deterioration of operating voltage characteristics. Additionally, in contrast to conventional recessed gate transistors, because an isolation layer must be removed to below a recessed gate in a FinFET, word line thickness increases. Thickening of word lines greatly increases coupling capacitance between the respective word lines, causing a signal transfer delay on the word lines. Further, when a word line adjacent to an active region is turned on, an electric field is concentrated at the junction, increasing leakage current and degrading refresh characteristics.

SUMMARY OF THE INVENTION

The invention provides a semiconductor device having a recessed channel and capable of achieving a desired threshold voltage margin while retaining the benefits of a transistor configured with a recessed channel, such as a FinFET.

Embodiments of the invention are also directed to a method for manufacturing a semiconductor device having a recessed channel, which is capable of minimizing removal of an isolation layer and improve refresh and cell current characteristics.

In one embodiment, a semiconductor device having a recessed channel comprises: a semiconductor substrate with an isolation layer defining an active region including a channel region and a junction region; a recessed trench including a top trench formed within the channel region, and a bottom trench formed from a lower surface of the top trench with a width narrower than the top trench; and a gate stack overlapping the recessed trench and extending across the active region.

The isolation layer adjacent to the channel region is preferably lower than the isolation layer adjacent to the junction region of the active region.

The recessed trench preferably includes a first protrusion disposed in a short axial direction of the active region, a second protrusion, and a bottom surface connecting the first protrusion and the second protrusion.

In another embodiment, a method for manufacturing a semiconductor device with a recessed channel comprises: forming a mask pattern on a semiconductor substrate defining an active region including a channel region and a junction region, the mask pattern blocking the junction region and exposing the channel region; forming a spacer of a predetermined thickness covering inner sidewalls of the mask pattern; forming a bottom trench within the semiconductor substrate, using the spacer as an etch mask; forming a hard mask pattern exposing the bottom trench and the spacer; etching the exposed spacer using the hard mask pattern as a mask; forming a protrusion in a dual fin configuration including a first protrusion exposed through using the hard mask pattern as a mask to etch the isolation layer, a second protrusion, and a bottom surface connecting the first protrusion and the second protrusion; forming a recessed trench comprising the bottom trench and a top trench, the top trench being formed wider than the bottom trench by etching the bottom trench using the hard mask pattern as a mask; and forming a gate stack overlapping the recessed trench.

DESCRIPTION OF SPECIFIC EMBODIMENTS

Hereinafter, a semiconductor device having a recessed channel and a method for manufacturing the same in accordance with the invention is described in detail with reference to the accompanying drawings.

Figure 1A:
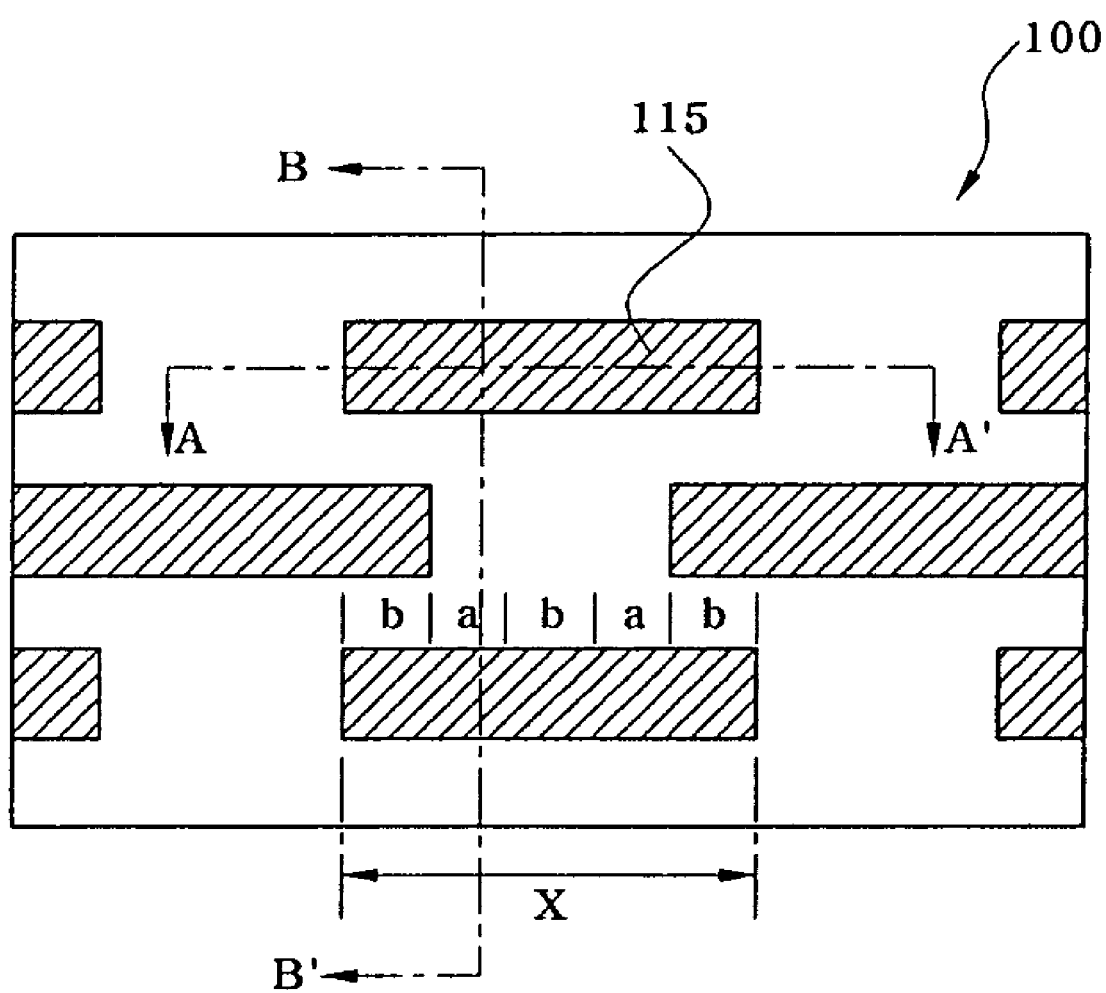
FIGS. 1A to 12C illustrate views of a semiconductor device having a recessed channel and a manufacturing method of the semiconductor device in accordance with embodiments of the invention.
Figure 1B:
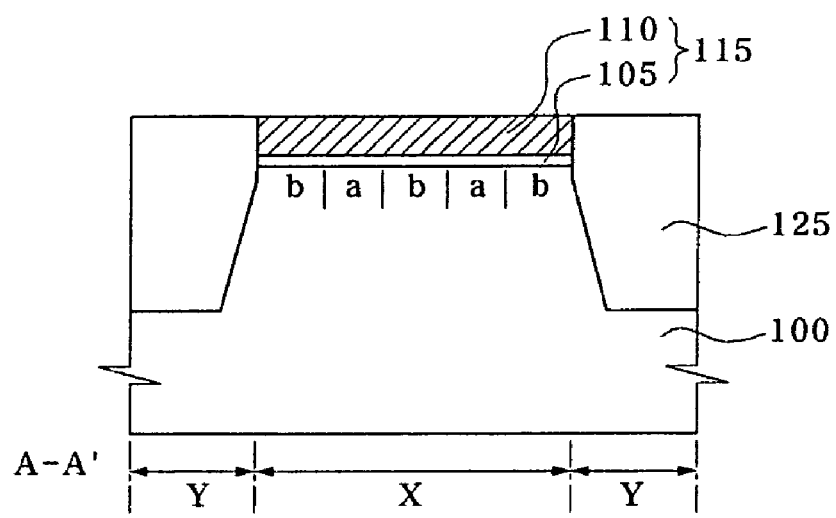
Figure 1C:
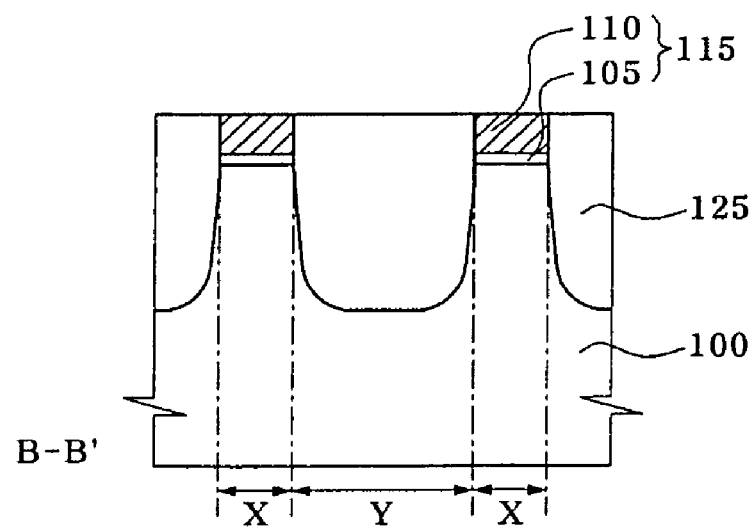

Referring to FIGS. 1A, 1B, and 1C, an isolation layer 125 defining an active region (X) and a device isolation region (Y) are formed on a semiconductor substrate 100. FIG. 1B and 1C illustrate cross-sectional views taken along lines A-A' and B-B', respectively, of FIG. 1A. (In all figures, the B and C views are cross-sectional views taken along lines A-A' and B-B' of the A view of the respective figure.) In detail, a first mask pattern 115 is formed on the semiconductor substrate 100 and includes the active region (X) and the device isolation region (Y) that shield and expose the semiconductor substrate 100, respectively. The first mask pattern 115 is formed with a stacked structure of a pad oxide pattern 105 and a pad nitride pattern 110. The pad oxide pattern 105 is preferably formed with a thickness ranging from approximately 50 Å to approximately 150 Å, and the pad nitride pattern 110 is preferably formed with a thickness ranging from approximately 500 Å to approximately 700 Å. The active region (X) includes and is defined with channel regions (a) and with junction regions (b) disposed at either side of the each channel region (a). The channel regions (a) are disposed on the active region (X) between the junction regions (b), and gate lines are formed overlapping two adjacent channel regions (a). Next, the first mask pattern 115 is used to selectively etch the semiconductor substrate 100 and form a device isolation trench. Then, after filling the device isolation trench with an isolation layer, a planarization process is performed to form an isolation layer 125 separating the active region (X) and the device isolation region (Y).

Figure 2A:
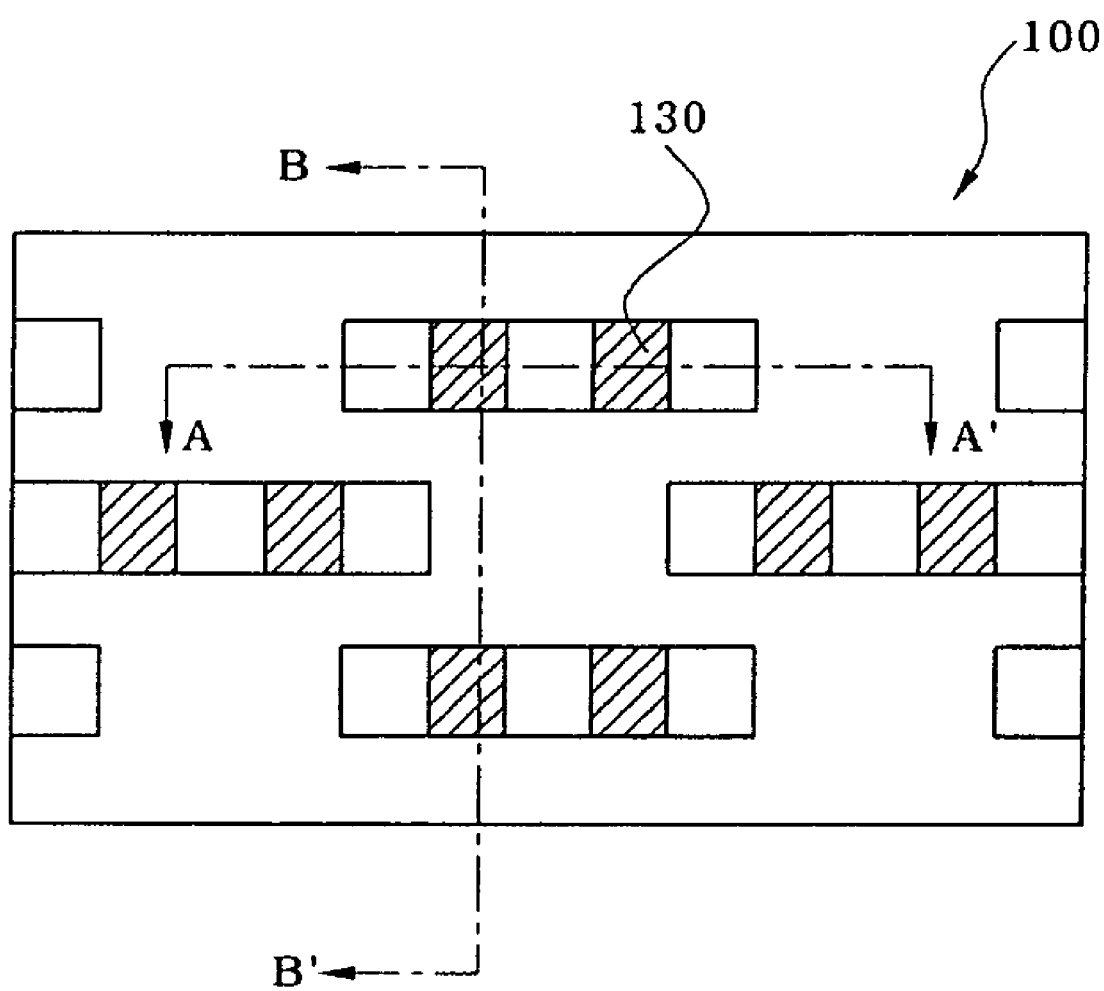
Figure 2B:
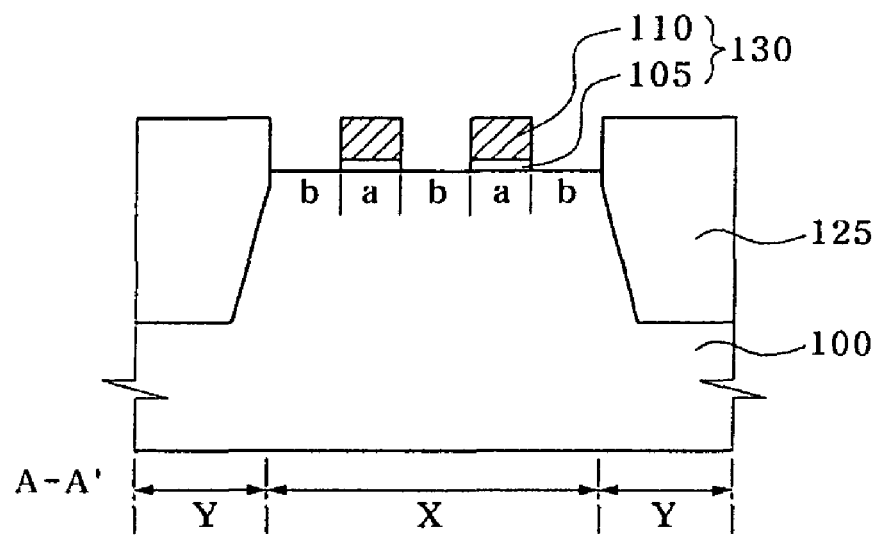
Figure 2C:
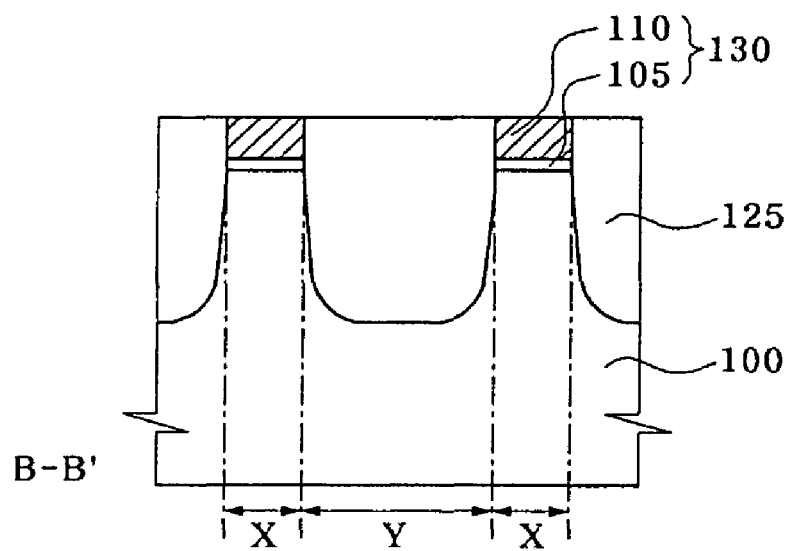

Referring to FIGS. 2A, 2B, and 2C, the first mask pattern 115 is patterned to form a second mask pattern 130 blocking the channel regions (a) of the active region (X). Specifically, a photoresist is applied on the first mask pattern 115, and photolithography including exposure and development processes is performed. Thus, a photoresist pattern (not shown) is formed to block the channel region (a) of the active region (X) and expose regions other than the channel regions (a). The photoresist pattern employs a negative-type photoresist material. According to the negative-type photoresist material, regions exposed to light during development are left. The photoresist pattern may be formed in a line formation along a channel region on which a gate line is to be formed. Next, the surface of the semiconductor substrate 100 is selectively exposed by etching the first mask pattern 115 excluding the channel regions (a) using the photoresist pattern as a mask. Then, the photoresist pattern is removed. Thus, as illustrated in FIG. 2A, the second mask pattern 130 is formed to block the channel regions (a) of the active region (X) of the semiconductor substrate 100.

Figure 3A:
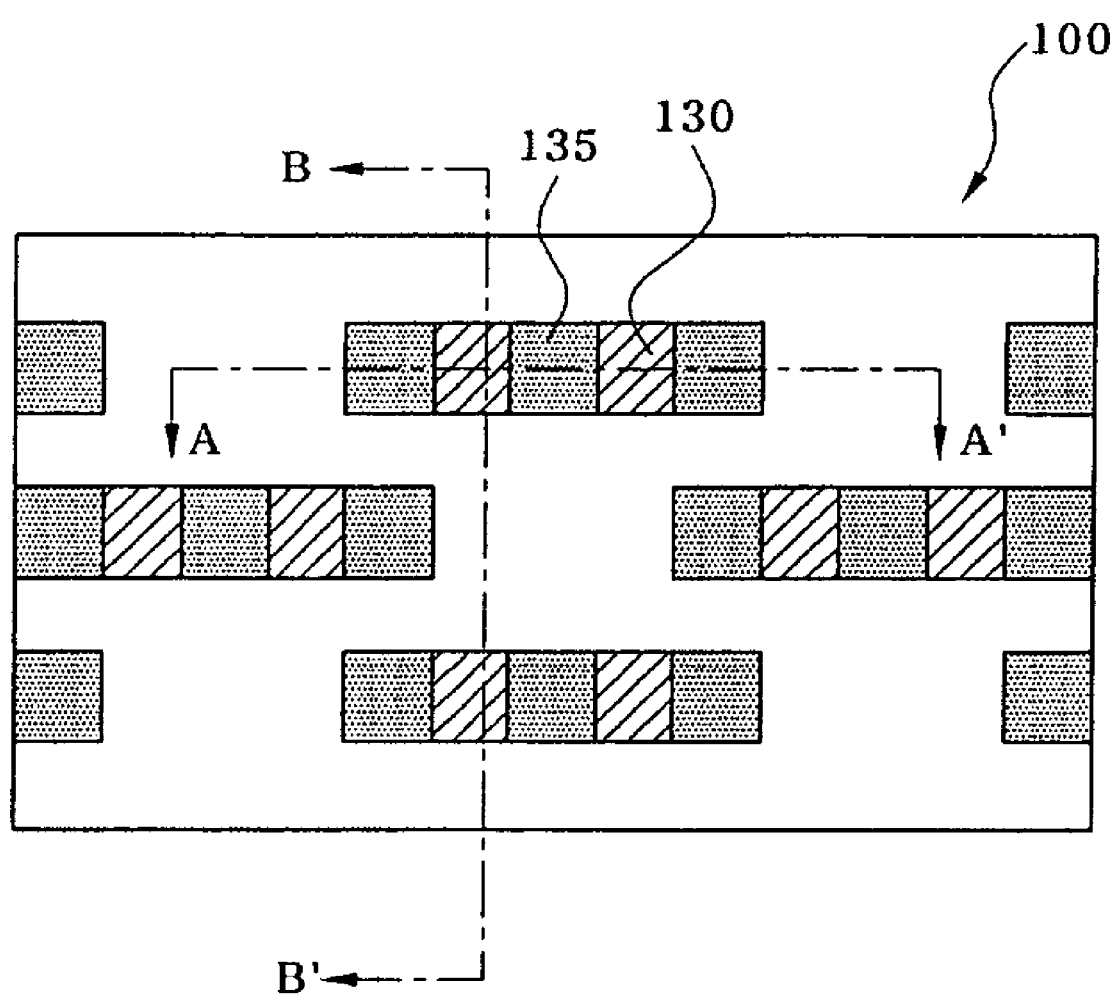
Figure 3B:
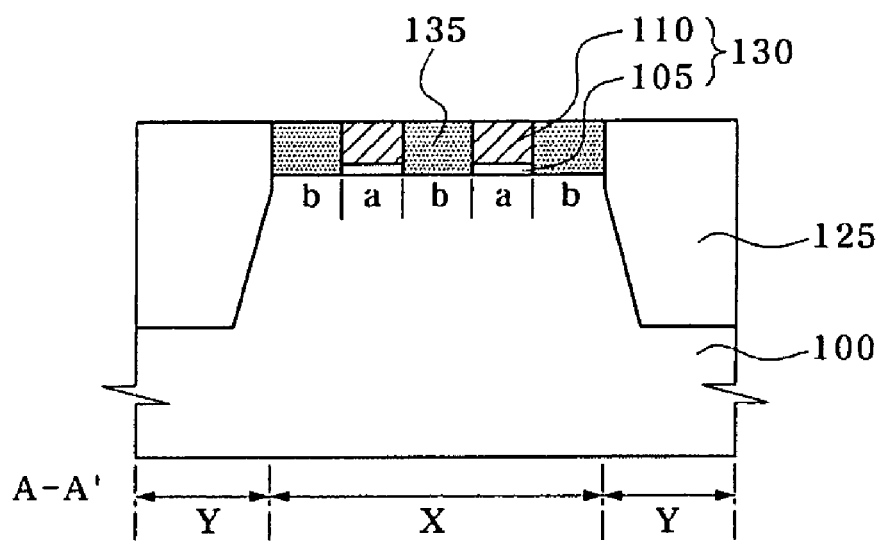
Figure 3C:
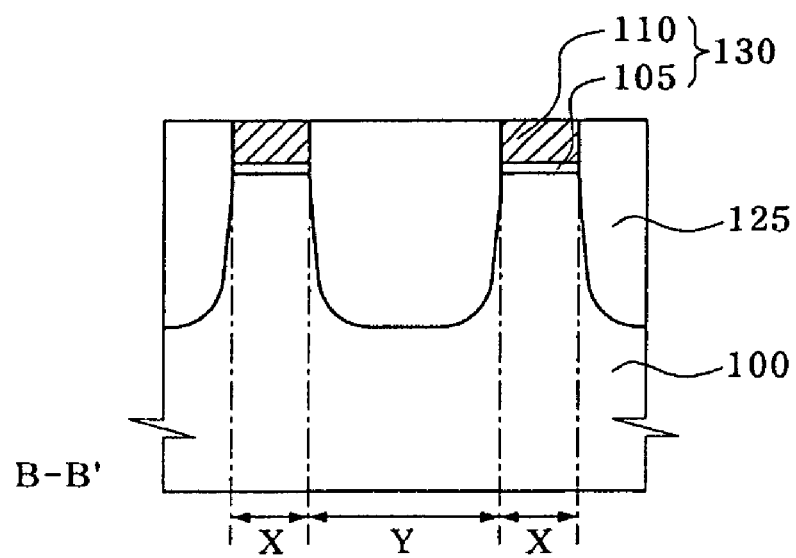

Referring to FIGS. 3A, 3B, and 3C, an insulating pattern 135 is formed to fill the second mask pattern 130 on the substrate 100. Specifically, an insulating layer is formed on the semiconductor substrate 100. This insulating layer is formed to a thickness sufficient to fill the second mask pattern 130 and regions of the semiconductor substrate 100 exposed by the second mask pattern 130. The insulating layer is preferably formed of a low pressure tetra ethyl ortho silicate (LPTEOS) film. Next, the insulating layer is planarized to expose the second mask pattern 130. The planarization process preferably employs chemical mechanical polishing (CMP) or an etch-back process. The planarization process removes the insulating layer on the second mask pattern 130 to form the insulating pattern 135 filling the junction regions (b) of the semiconductor substrate 100.

Figure 4A:
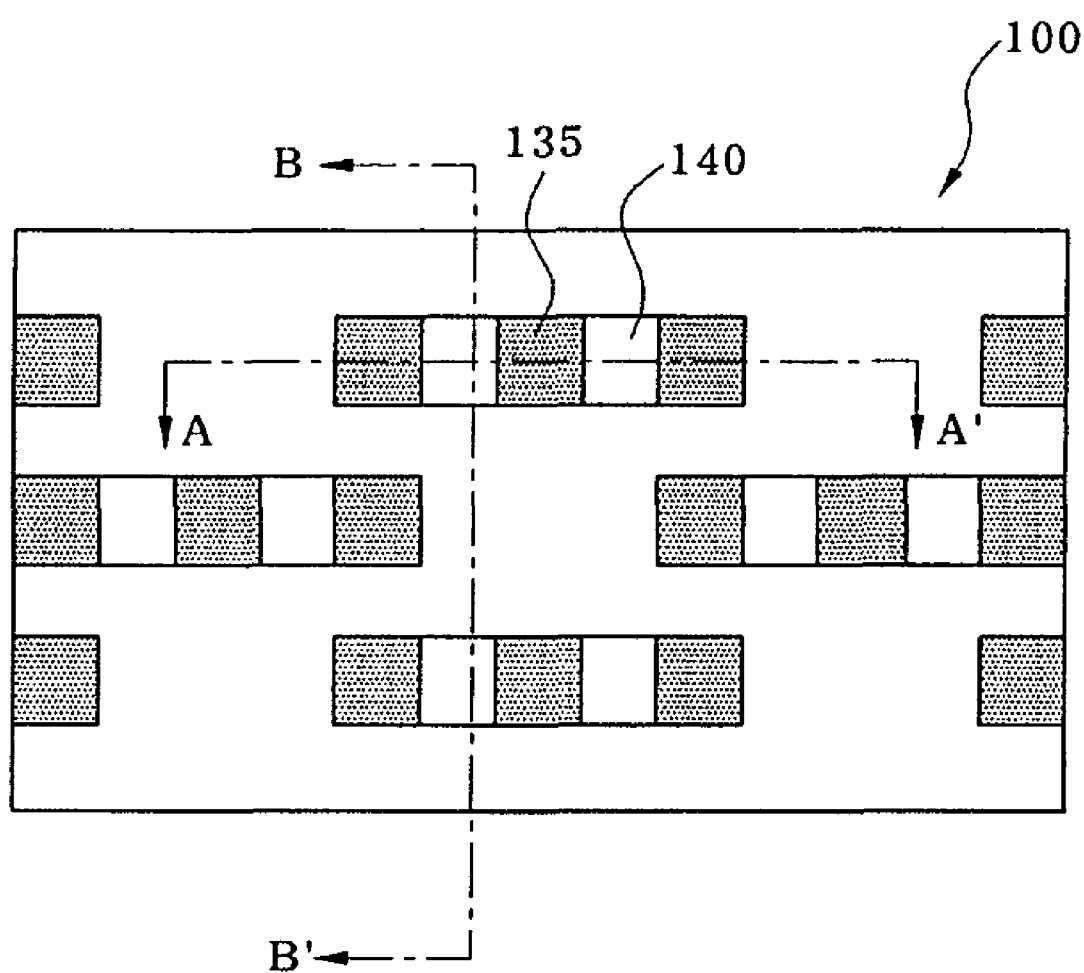
Figure 4B:
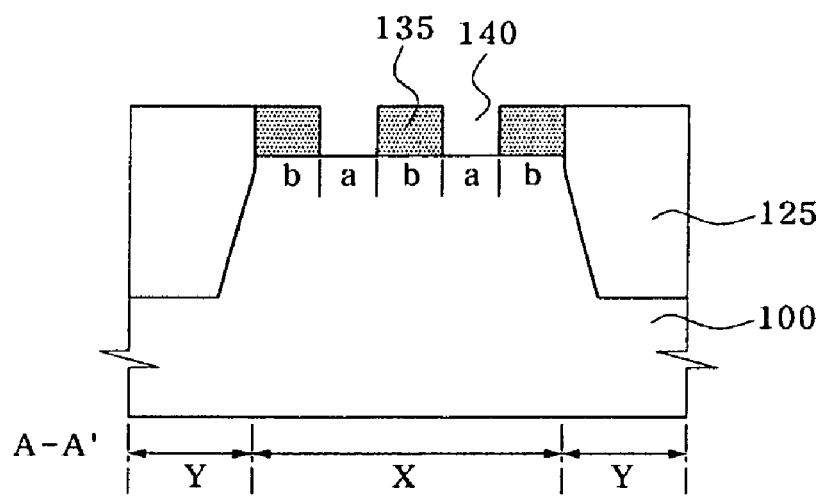
Figure 4C:
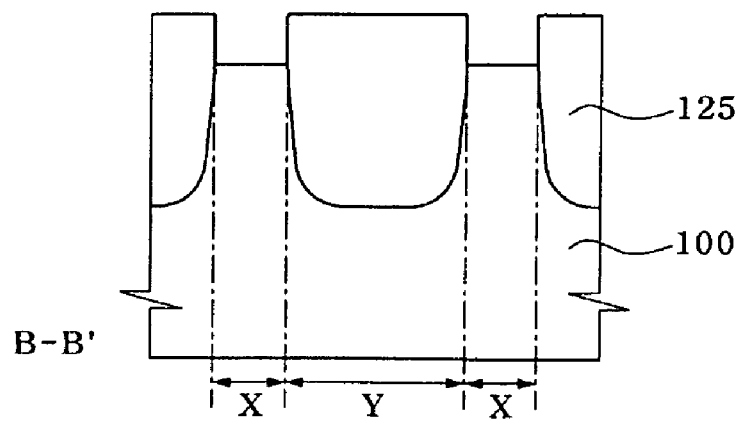

Referring to FIGS. 4A, 4B, and 4C, a strip process is performed on the semiconductor substrate 100 to remove the second mask pattern 130. Then, a first opening 140 is formed exposing the surface of the semiconductor substrate 100 in the channel regions (a) between the insulating pattern 135. The strip process is preferably performed using a phosphoric acid ($H_3PO_4$) solution.

Figure 5A:
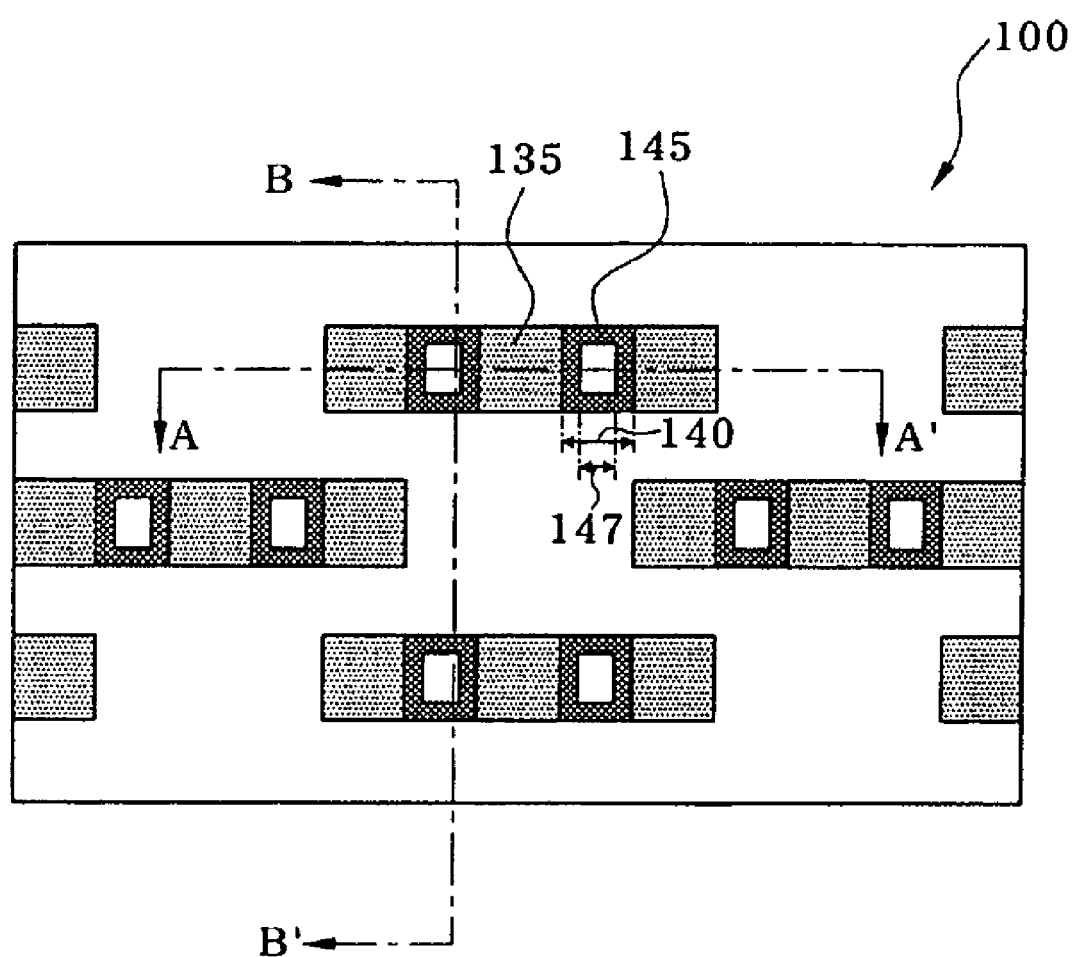
Figure 5B:
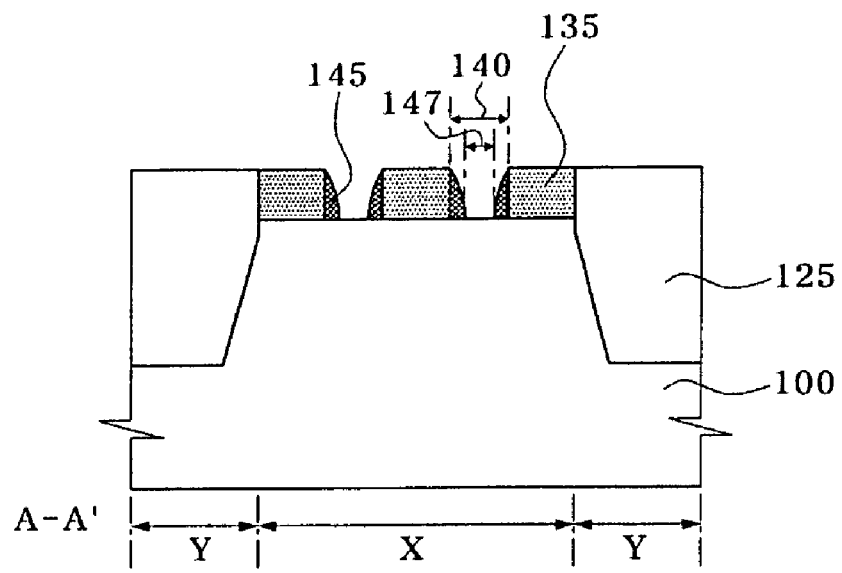
Figure 5C:
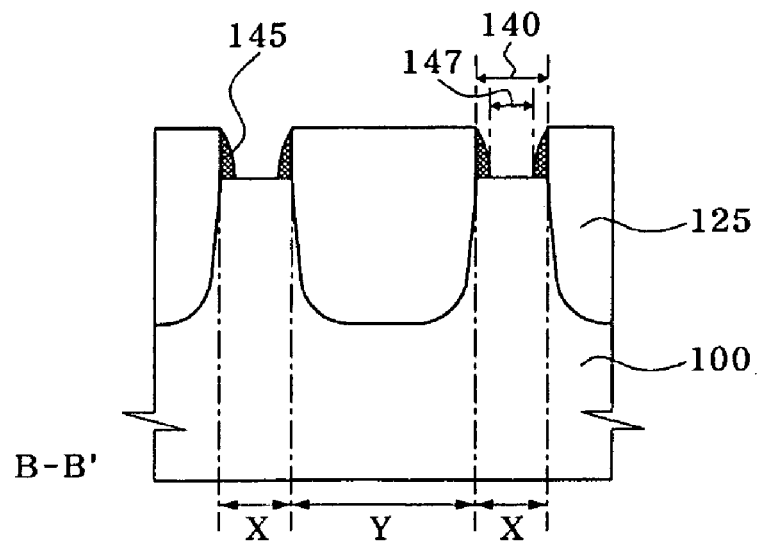

Referring to FIGS. 5A, 5B, and 5C, a spacer 145 is formed on the exposed surface of the insulating pattern 135 defining the first opening 140. Specifically, a spacer is deposited on the semiconductor substrate 100 exposed by the insulating pattern 135. The spacer is preferably deposited at a thickness ranging from approximately 50 Å to approximately 200 Å. The spacer is etched to form the spacer 145 covering the side surfaces of the insulating pattern 135. Referring to FIG. 5A, the spacer 145 is formed at a predetermined thickness to cover the first opening 140 formed in the insulating pattern 135, to form a second opening 147 that is reduced in inner width by the predetermined thickness of the spacer 145 from the inner width of the first opening 140.

Figure 6A:
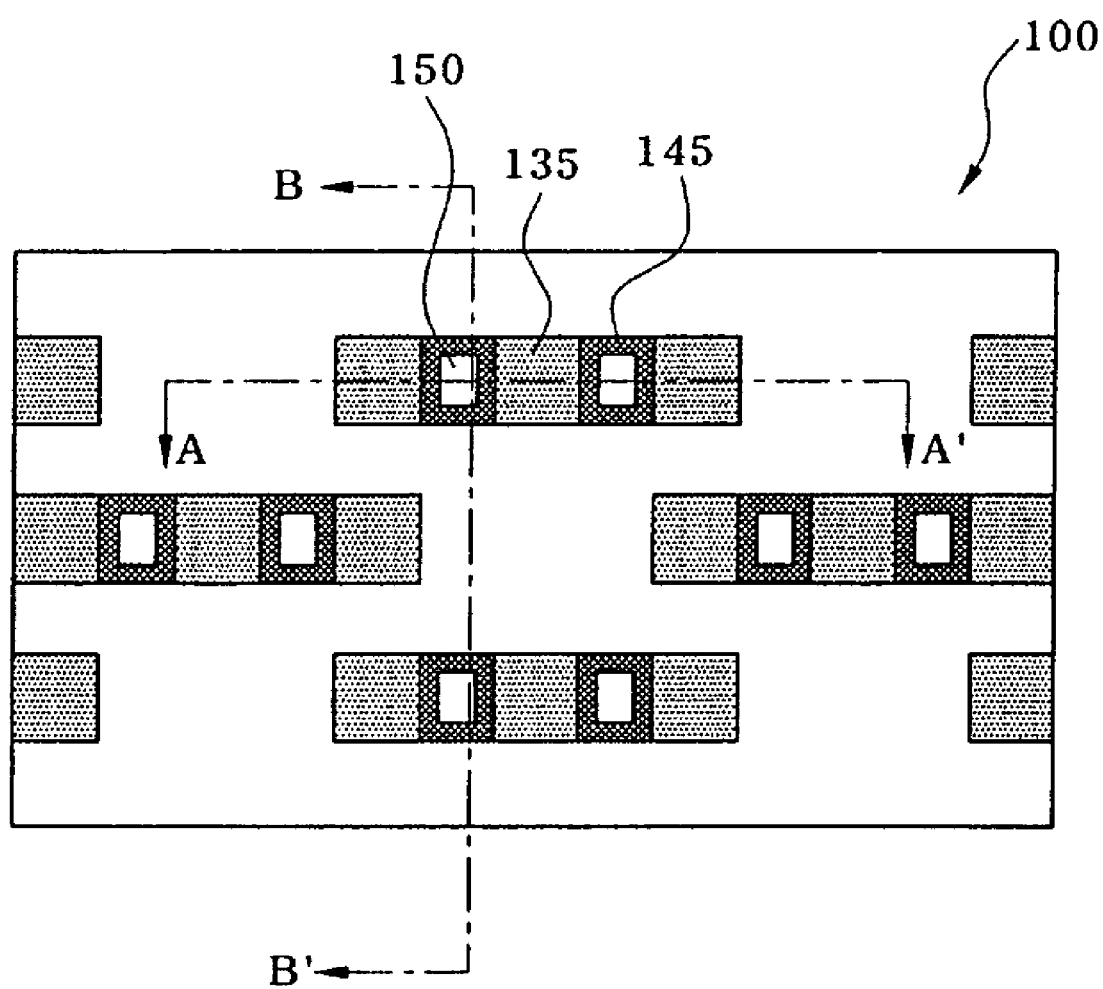
Figure 6B:
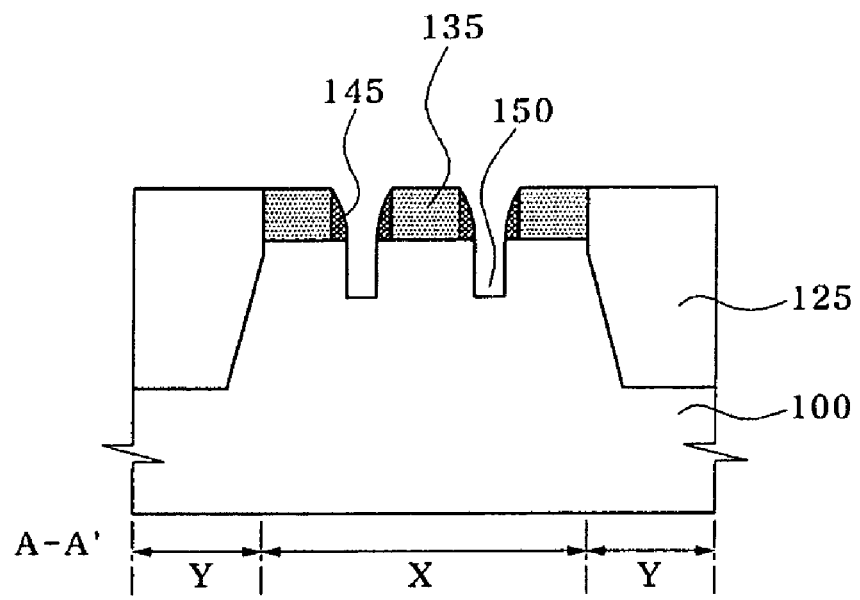
Figure 6C:
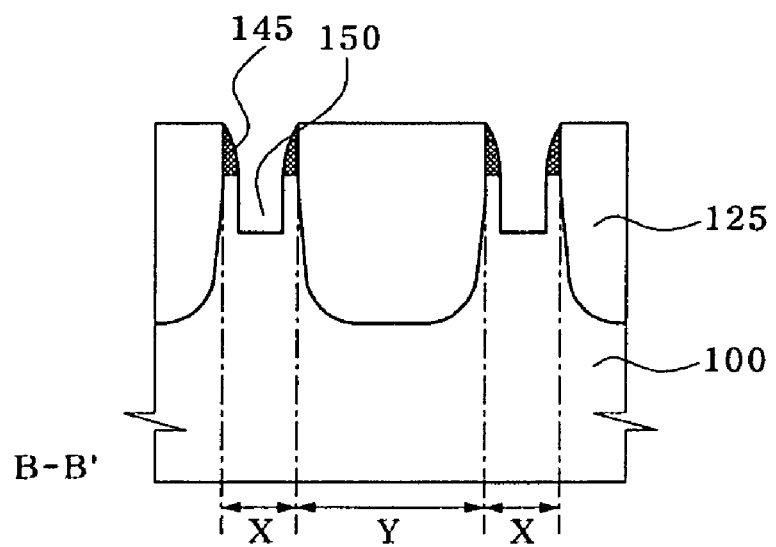

Referring to FIGS. 6A, 6B, and 6C, the spacer 145 is used as a barrier layer to etch a region of the semiconductor substrate 100 exposed by the second opening 147 and form a bottom trench 150. The bottom trench 150 is preferably formed to have a depth ranging from approximately 400 Å to approximately 800 Å from the surface of the semiconductor substrate 100.

Figure 7A:
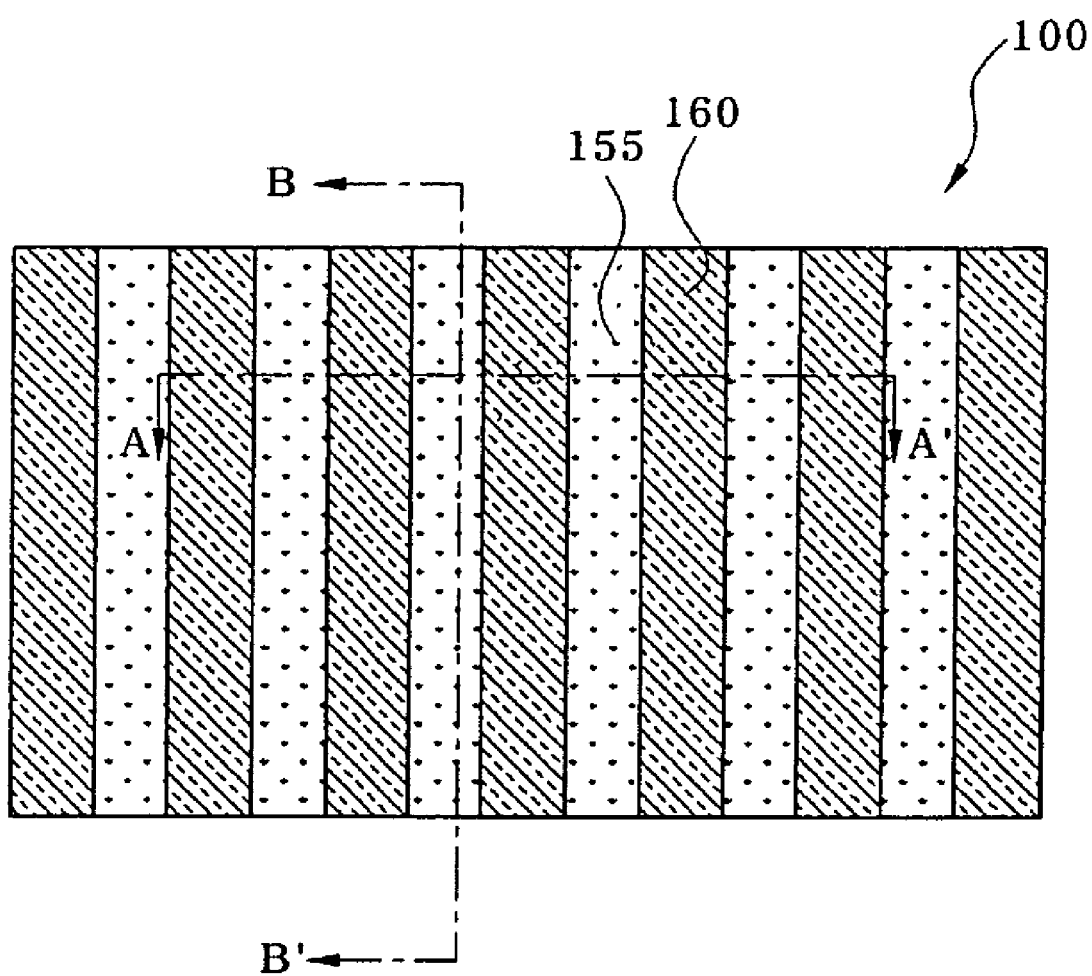
Figure 7B:
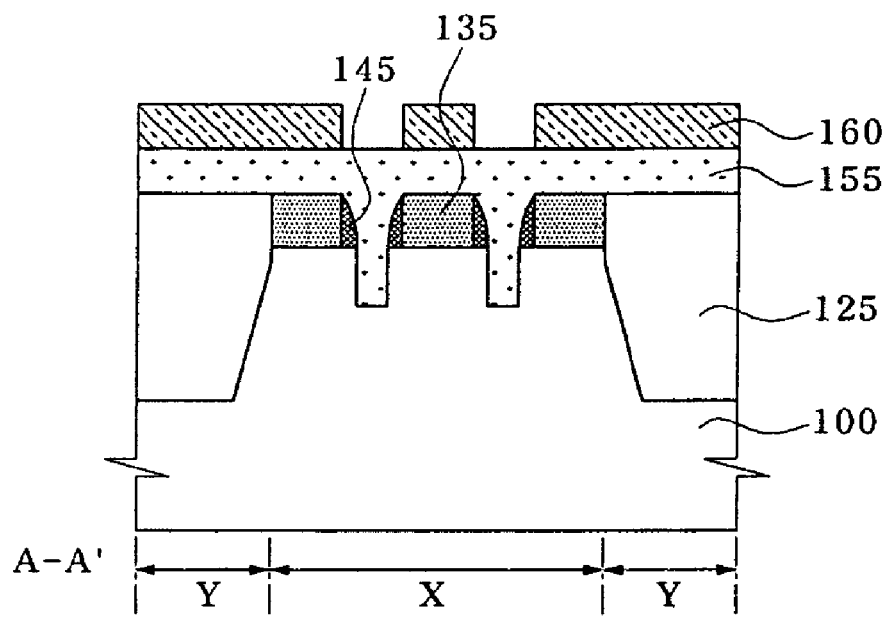
Figure 7C:
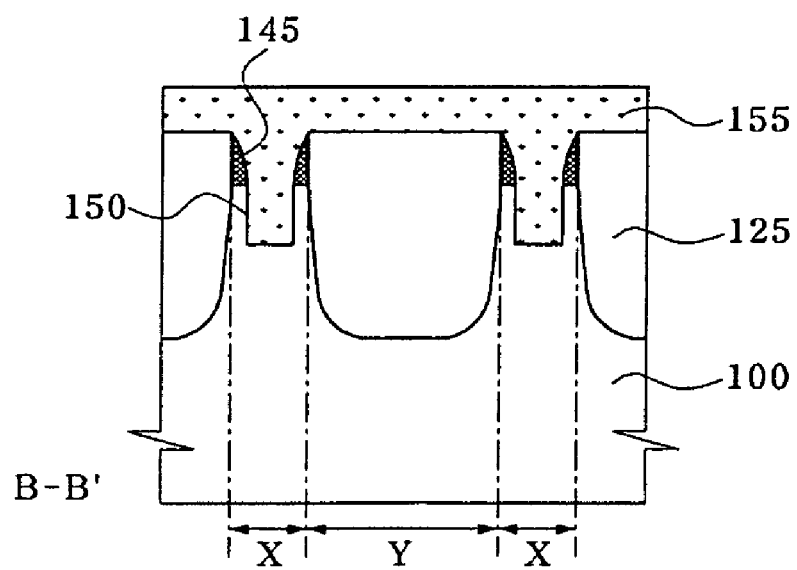

Referring to FIGS. 7A, 7B, and 7C, a hard mask layer 155 is deposited on the semiconductor substrate 100. The hard mask layer 155 is formed to a thickness sufficient to fill the bottom trench 150 formed in the semiconductor substrate 100. A photoresist pattern 160 is formed exposing the forming region of the bottom trench 150 on the hard mask layer 155. The hard mask layer 155 is preferably an amorphous carbon film, preferably deposited at a thickness ranging from approximately 2000 Å to approximately 3000 Å.

Figure 8A:
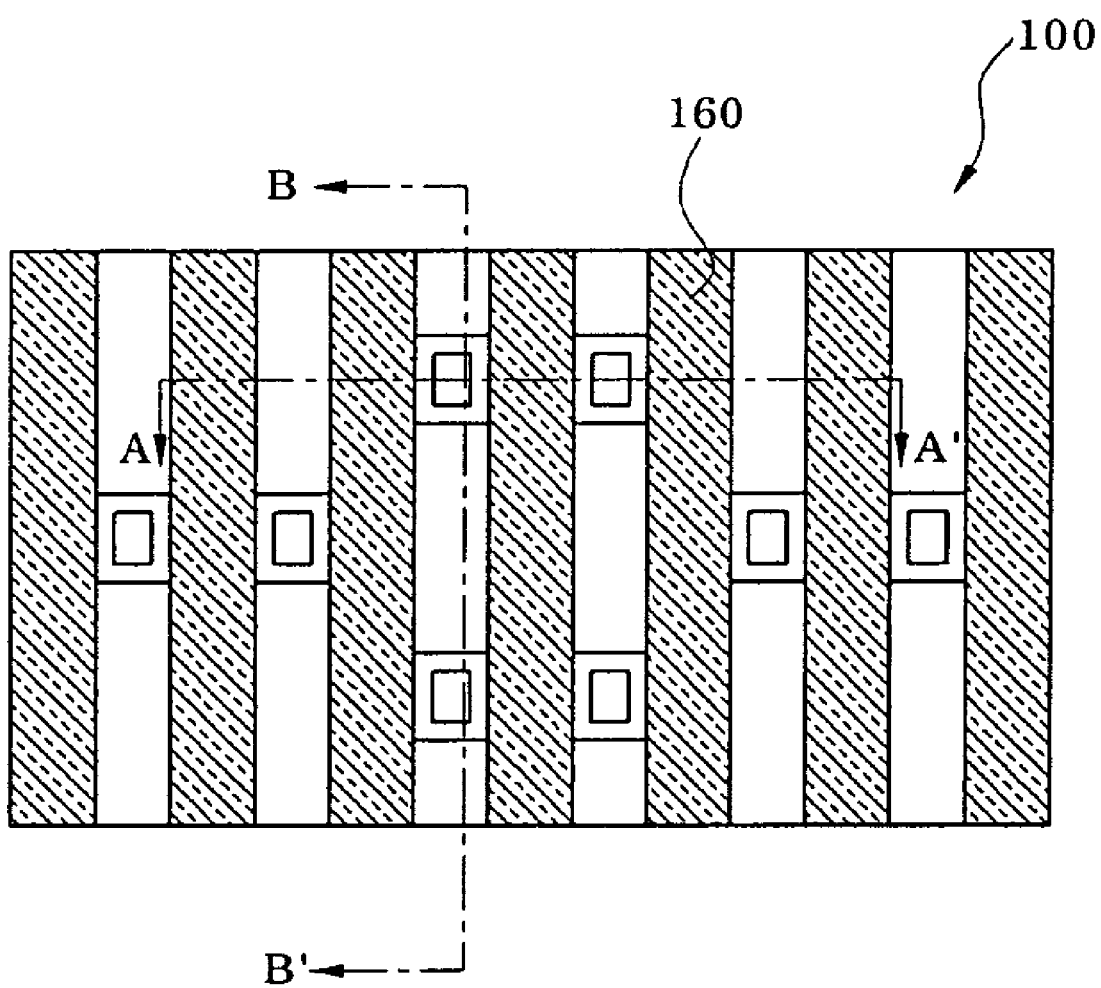
Figure 8B:
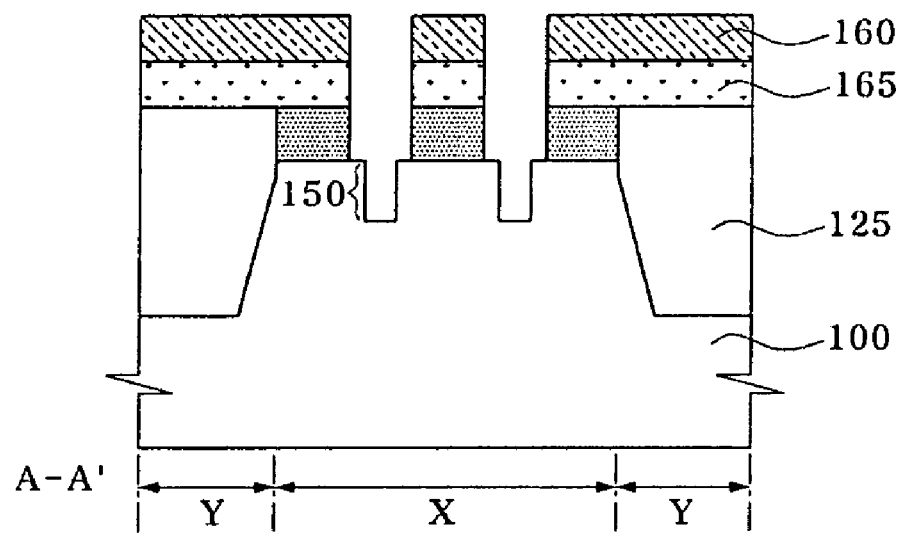
Figure 8C:
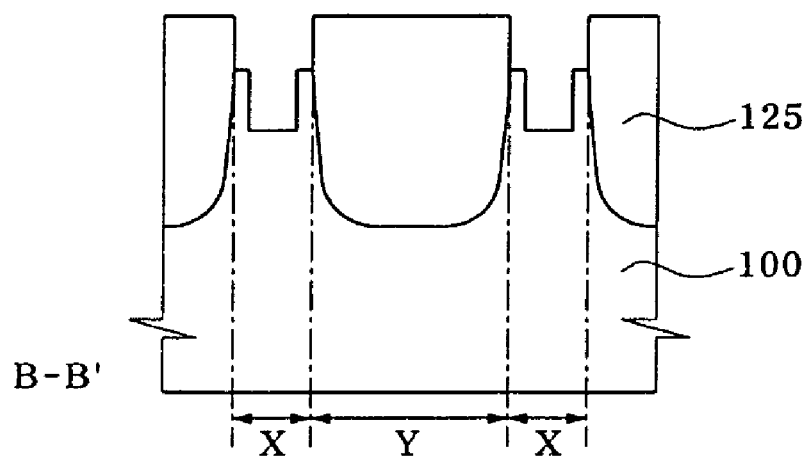

Referring to FIGS. 8A, 8B, and 8C, the photoresist pattern 160 is used as a mask to etch the hard mask layer 155 and form a hard mask pattern 165 exposing the spacer 145. The photoresist pattern 160 and the hard mask pattern 165 are used as a mask to etch the exposed spacer 145. Then, the photoresist pattern 160 is removed.

Figure 9A:
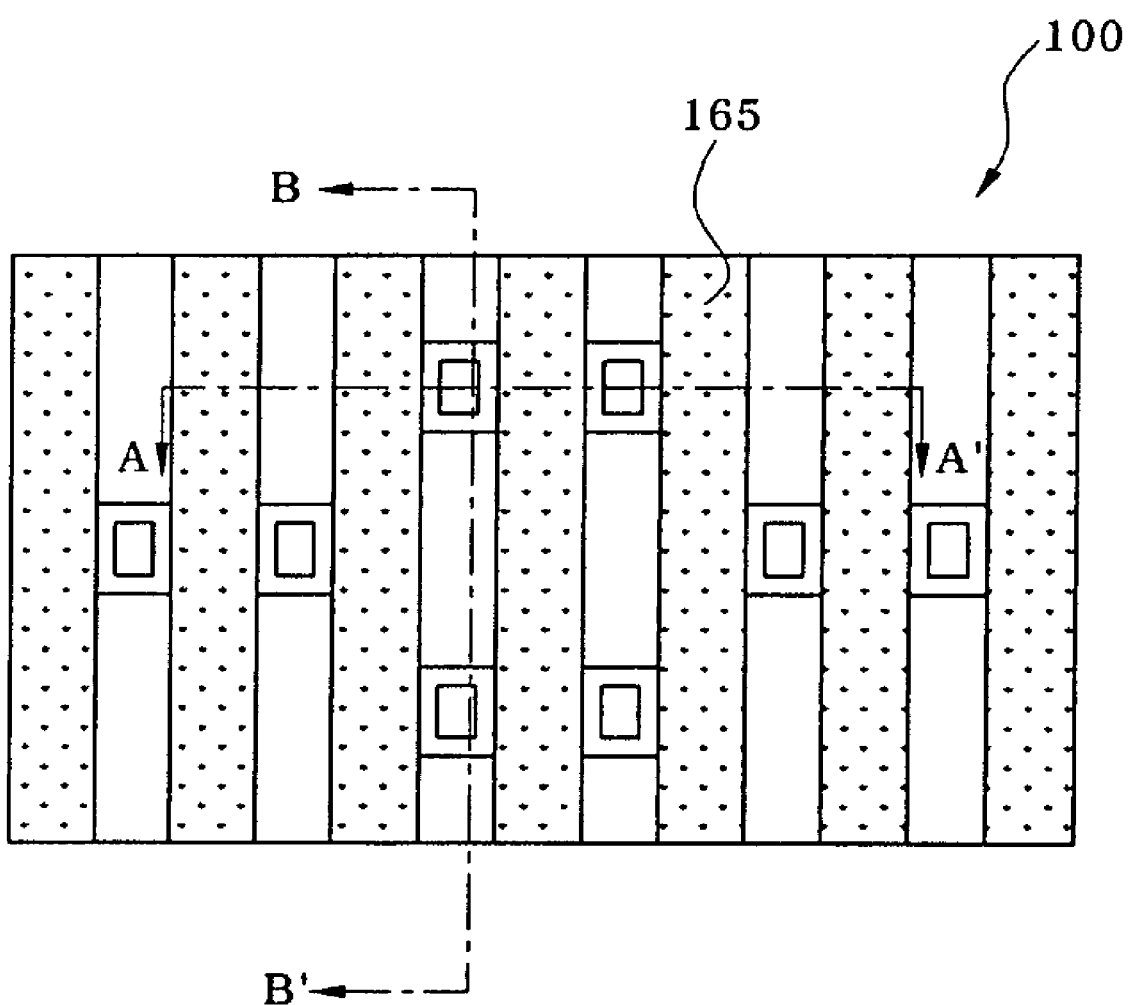
Figure 9B:
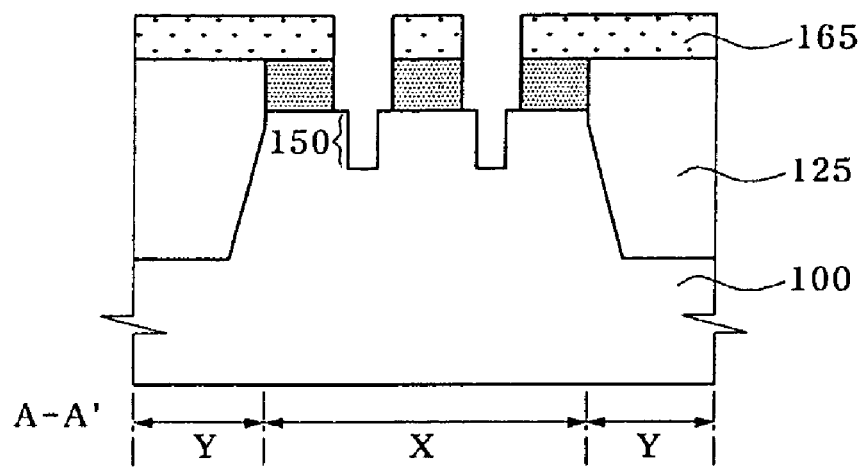
Figure 9C:
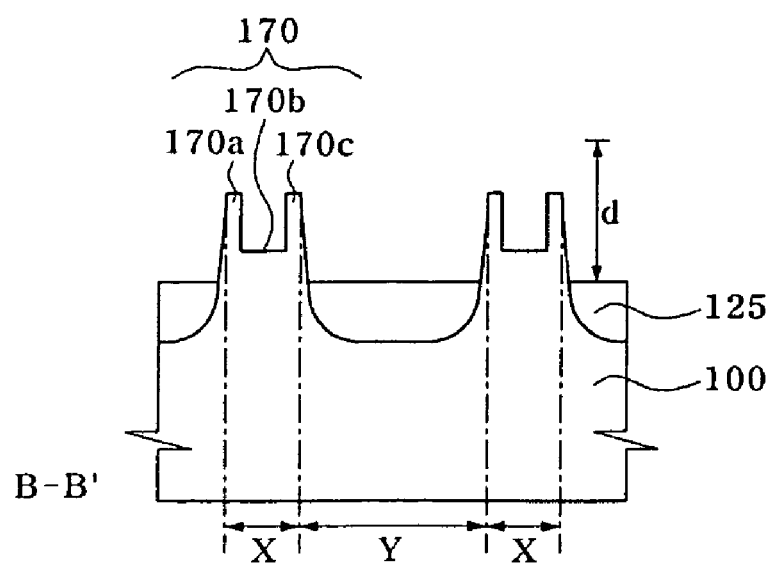

Referring to FIGS. 9A, 9B, and 9C, the hard mask pattern 165 and the insulating pattern 135 are used as a mask, and an etch source with a higher etch selectivity for silicon with respect to an oxide film is supplied to etch the isolation layer 125 from the exposed surface by a predetermined depth (d). Referring to the sectional view taken along line B-B' of FIG. 9C, the isolation layer 125 is etched a predetermined depth (d) from its surface—for example, to a depth preferably ranging from approximately 1500 Å to approximately 2000 Å. The etch source supplied to the semiconductor substrate 100 has a sufficiently higher etch selectivity for silicon with respect to an oxide film that the semiconductor substrate 100 is not etched, and only isolation layer 125 exposed by the hard mask pattern 165 is etched a predetermined depth (d). Accordingly, a protrusion 170 with a dual fin configuration extending in a short axial direction of the active region is formed to include a first protrusion 170a, a second protrusion 170c, and a bottom surface 170c connecting the first protrusion 170a and the second protrusion 170b. By forming the recessed trench bottom surface in a dual fin configuration, an effective cell data writing time can be realized. Thus, the semiconductor device can be highly integrated while defect occurrence in write recovery time (TWR) of major yield loss data can be reduced. Therefore, even with a design rule reduction from high integration of a memory device, a semiconductor device with normal cell operating characteristics can be attained.

Figure 10A:
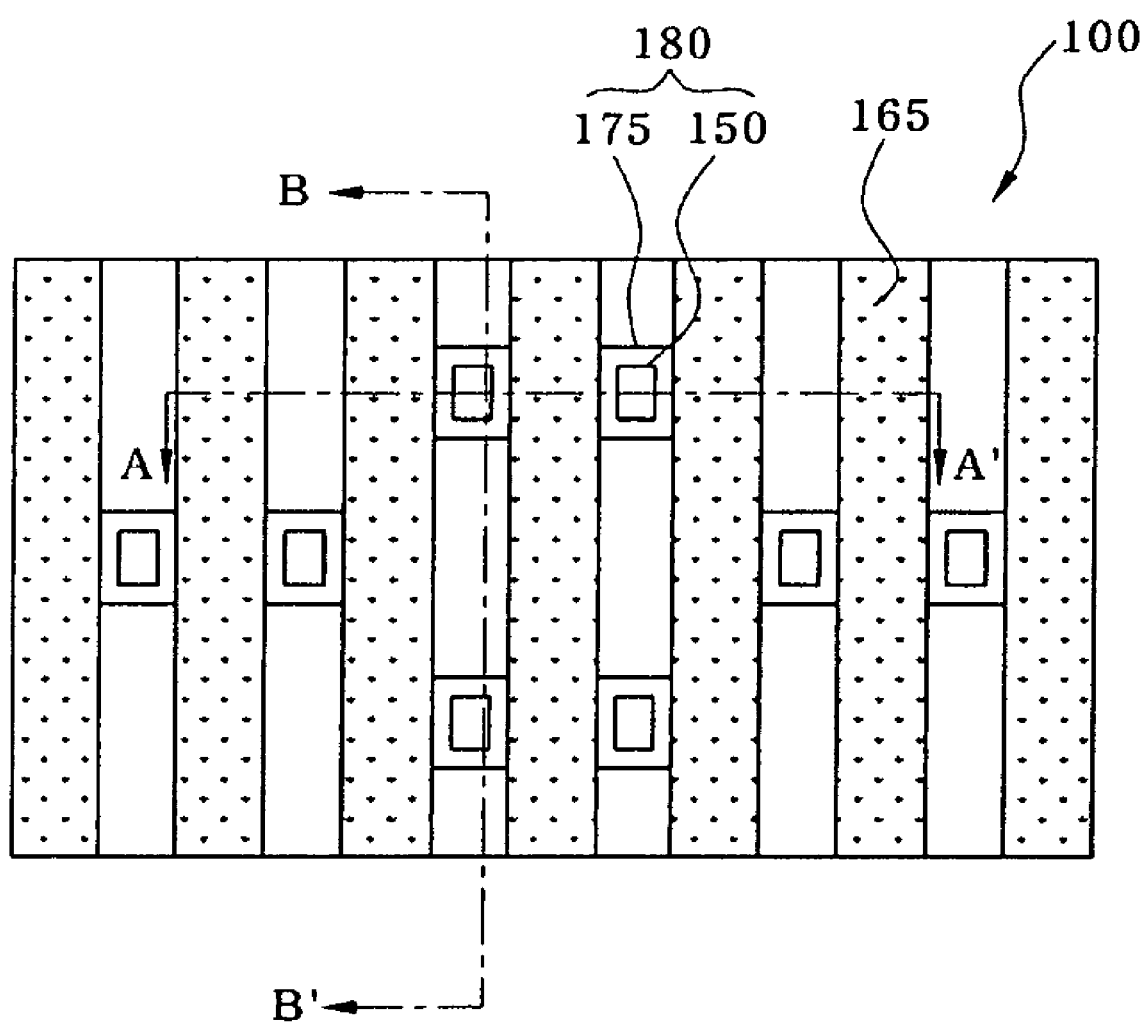
Figure 10B:
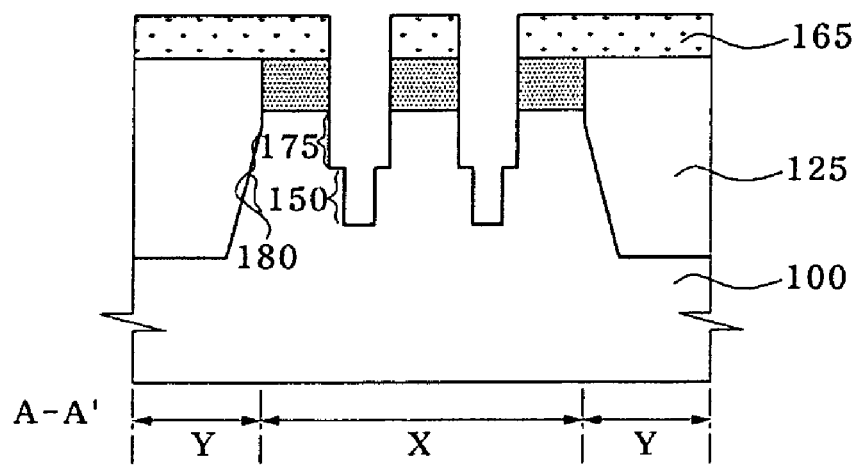
Figure 10C:
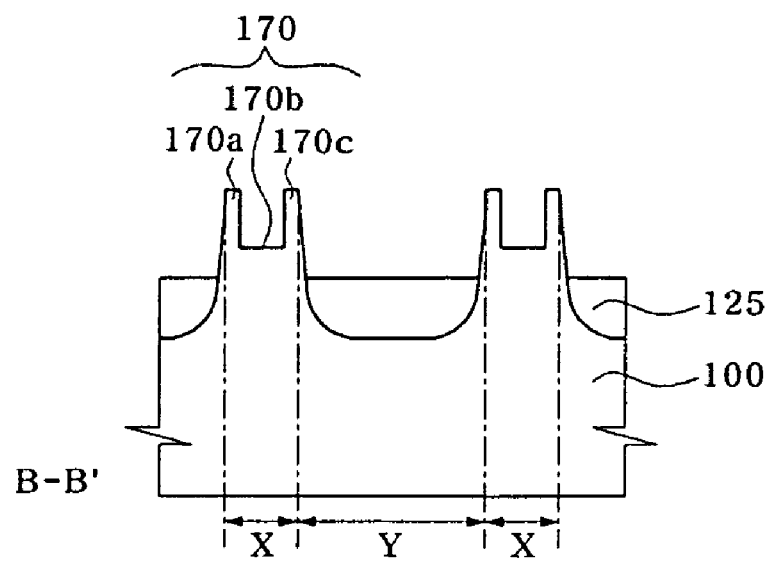

Referring to FIGS. 10A, 10B, and 10C, the hard mask pattern 165 and the insulating pattern 135 are employed as a mask, an etch source having a higher etch selectivity for an oxide film with respect to silicon is supplied to the semiconductor substrate 100 to etch the semiconductor substrate 100 and form a top trench 175. The top trench 175 is etched a predetermined depth from the surface of the semiconductor substrate 100—for example, to a depth preferably ranging from approximately 700 Å to approximately 1500 Å. During etching of the top trench 175, the bottom trench 150 is also etched. Thus, a recessed trench 180 with a dual fin configuration including top trench 175 and a bottom trench 150 narrower than the top trench 175 is formed in the semiconductor substrate 100. The bottom trench 150 retains its width and is formed deeper than the top trench 175.

Figure 11A:
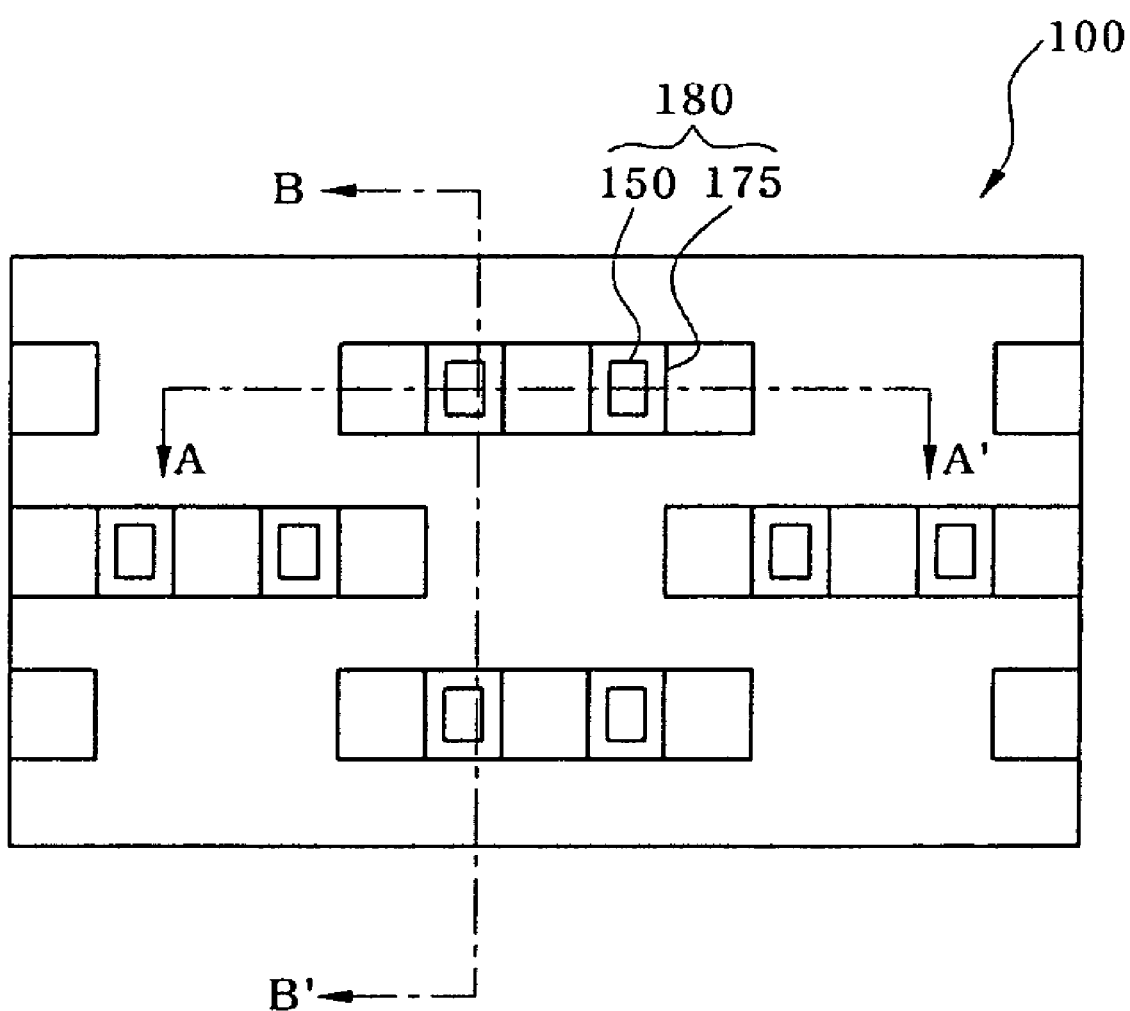
Figure 11B:
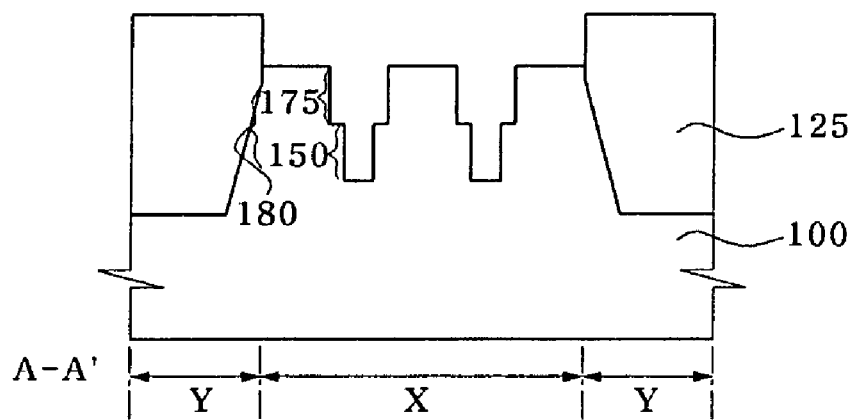
Figure 11C:
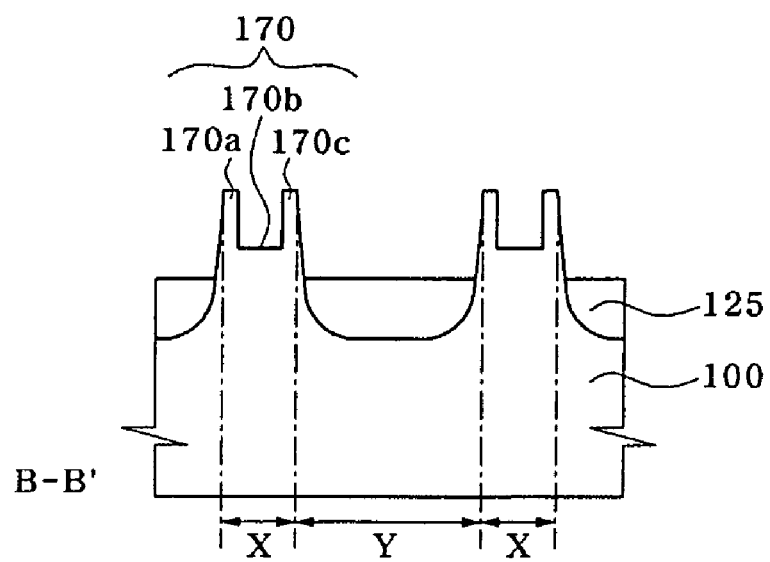

Referring to FIGS. 11A, 11B, and 11C, the hard mask pattern 165 and the insulating pattern 135 are removed.

Figure 12A:
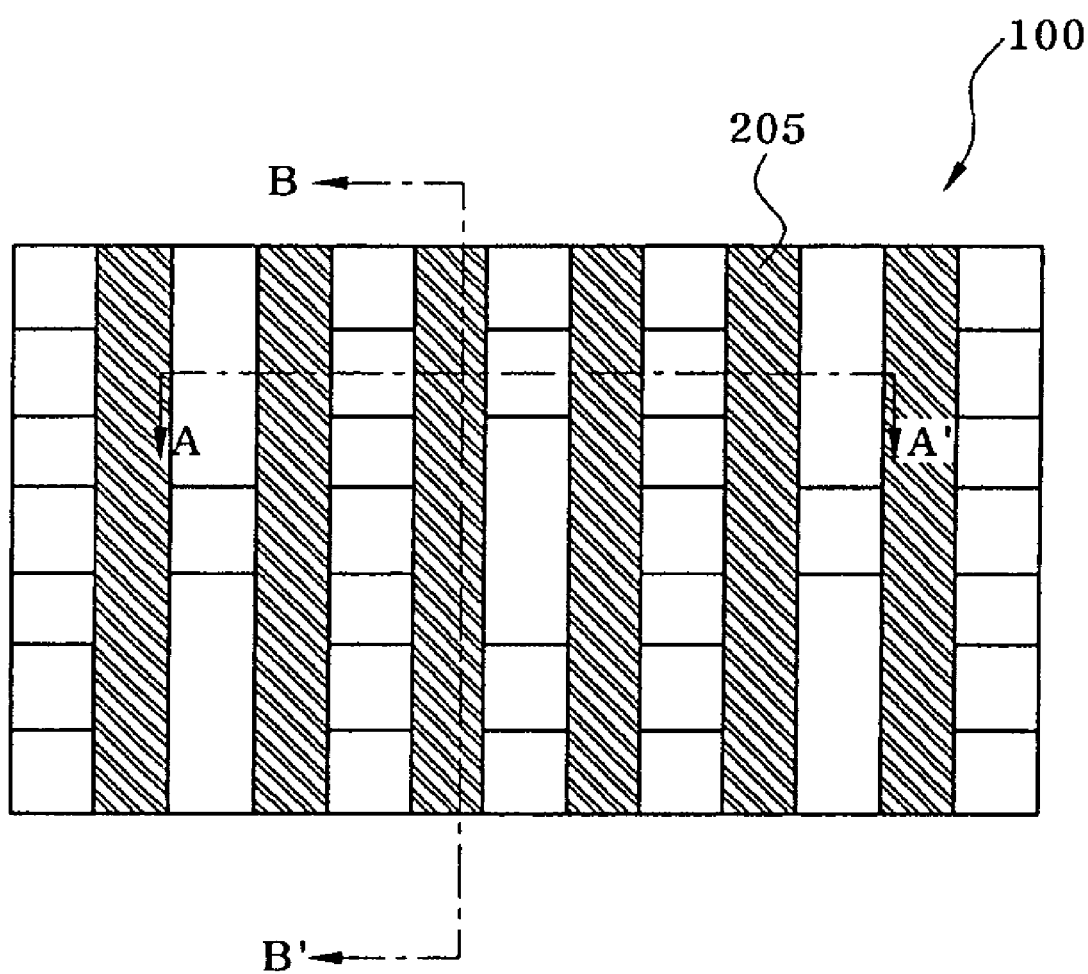
Figure 12B:
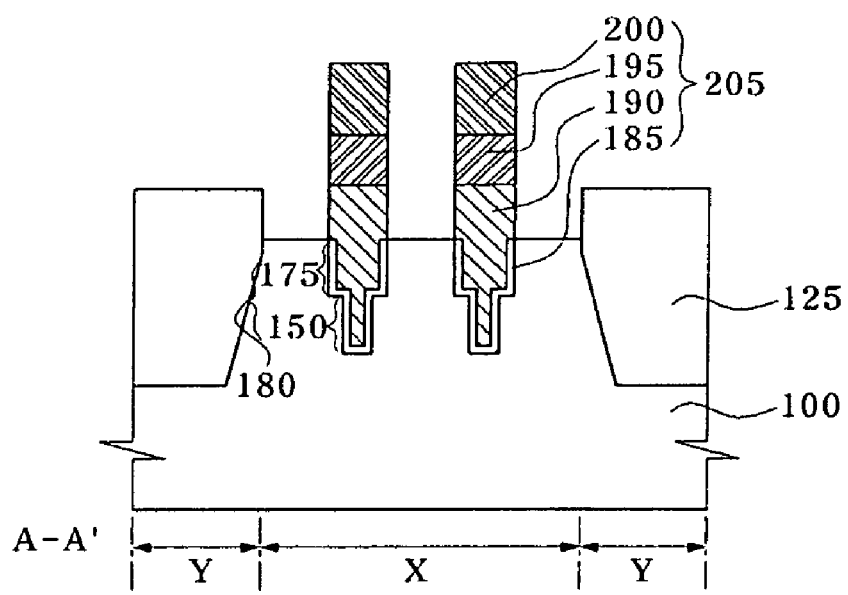
Figure 12C:
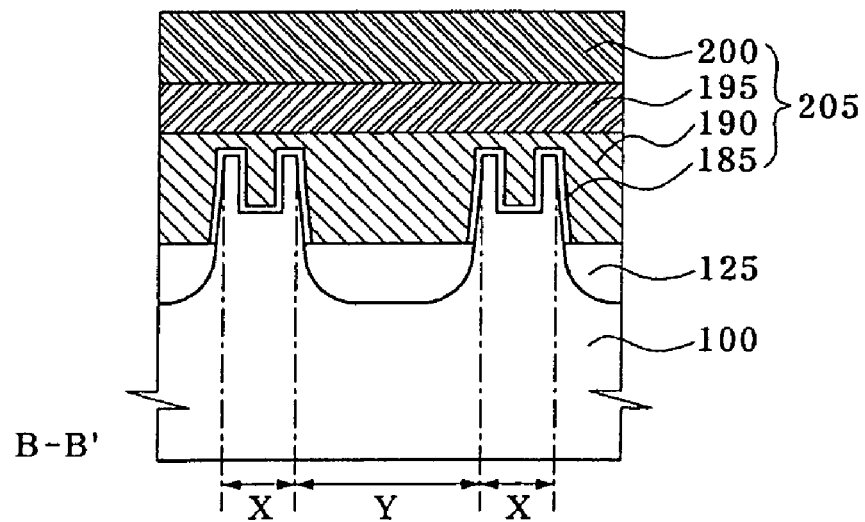

Referring to FIGS. 12A, 12B, and 12C, a gate stack 205 is formed overlapping the recessed trench 180 of the dual configuration. Specifically, preferably an oxide film with a thickness preferably ranging from approximately 30 Å to approximately 50 Å is formed as a gate insulating layer on the semiconductor substrate 100, and preferably a polysilicon film is doped as a gate conductive layer at a thickness preferably ranging from approximately 400 Å to approximately 700 Å. Preferably, a tungsten silicide (WSix) film is formed as a gate metal layer on a gate conductive layer at a thickness preferably ranging from approximately 1000 Å to approximately 1500 Å, and a hard mask layer is formed with a thickness preferably ranging from approximately 2000 Å to approximately 2500 Å. A gate stack 205 is formed by performing a selective etching process for gate patterning. The gate stack 205, as illustrated in FIG. 12A, is formed as a line type stack, and includes a gate insulating pattern 185, a gate conductive pattern 190, a gate metal pattern 195, and a hard mask pattern 200. Although not illustrated, source/drain regions are formed by implanting source/drain impurities.

Although preferred embodiments of the invention have been disclosed for illustrative purposes, various modifications, additions and substitutions are possible, without departing from the scope and spirit of the invention as defined in the accompanying claims.

What is claimed is:

1. A semiconductor device with a recessed channel, the semiconductor device comprising:
    a semiconductor substrate with an isolation layer defining an active region, said active region comprising a channel region and a junction region, wherein the isolation layer adjacent to the channel region is lower than the isolation layer adjacent to the junction region;
    a recessed trench comprising a top trench formed within the channel region and a bottom trench formed from a bottom surface of the top trench with a width narrower than the top trench; and
    a gate stack filling the recessed trench and extending across the active region.

2. The semiconductor device of claim 1, wherein the recessed trench comprises a first protrusion disposed in a short axial direction of the active region, a second protrusion, and a bottom surface connecting the first protrusion and the second protrusion.

3. The semiconductor device of claim 2, wherein the first protrusion and the second protrusion comprise a outer sidewall, a top surface, and a inner sidewall.

* * * * *